(12) United States Patent
White

(10) Patent No.: US 7,588,074 B1
(45) Date of Patent: Sep. 15, 2009

(54) IN THE RATE OF ENERGY TRANSFER ACROSS BOUNDARIES

(76) Inventor: Robert Alvin White, 11482 Winkler Rd., Falcon, MO (US) 65470

( * ) Notice: Subject to any disclaimer, the term of this patent is extended or adjusted under 35 U.S.C. 154(b) by 235 days.

(21) Appl. No.: 11/312,276

(22) Filed: Dec. 20, 2005

Related U.S. Application Data

(60) Provisional application No. 60/638,299, filed on Dec. 21, 2004.

(51) Int. Cl.
H05K 7/20 (2006.01)
(52) U.S. Cl. ................... 165/185; 165/166; 257/722; 361/704
(58) Field of Classification Search ........... 165/166, 165/185; 257/722; 361/704
See application file for complete search history.

(56) References Cited

U.S. PATENT DOCUMENTS

| | | | | |
|---|---|---|---|---|
| 1,480,362 | A | | 1/1924 | Anderson |
| 2,087,240 | A | | 7/1937 | Brown |
| 2,529,013 | A | * | 11/1950 | Gloyer ................. 165/166 |
| 3,520,357 | A | * | 7/1970 | Bruner ................. 165/166 |
| 3,524,497 | A | * | 8/1970 | Chu et al. ............... 165/185 |
| 5,172,755 | A | * | 12/1992 | Samarov ............... 165/185 |
| 5,511,145 | A | | 4/1996 | Bailey et al. |
| 6,039,114 | A | * | 3/2000 | Becker et al. ........... 165/170 |
| 6,390,181 | B1 | * | 5/2002 | Hall et al. .............. 165/185 |
| 6,691,769 | B2 | * | 2/2004 | Johnson et al. .......... 165/185 |
| 6,691,770 | B2 | * | 2/2004 | Wagner ............... 165/104.33 |
| 6,729,383 | B1 | * | 5/2004 | Cannell et al. .......... 165/185 |

FOREIGN PATENT DOCUMENTS

JP 02073697 A * 3/1990

OTHER PUBLICATIONS

Fraas et al, "Heat Exchanger Design," 1965, John Wiley and Sons, pp. cover, 33, 351,352.*
Linwood™ II ceiling by Acoustical Surfaces, Inc., 123 Columbia Court North, Suite201, Chaska,MN 55318.
Anechoic chamber, p. 7, www.lenardaudio.com Lenard Audio,32 GeorgeSt,North Lambton,NSW 2299, Australia.
ERS-2 Spacecraft and its Payload, Francis, et al., ESA Bulletin Nr. 83, Aug. 1995, p. 1 & 10.
ACK Technology catalog, 6081 Dale St.,Unit C, Buena Park,CA 90621. www.acktechnology.com/image005/png.

* cited by examiner

Primary Examiner—Leonard R Leo
(74) Attorney, Agent, or Firm—Richard L. Marsh

(57) ABSTRACT

A heat exchanger comprises at least one first fluid passage contiguous with at least one second fluid passage. The first fluid passage is separated from the second fluid passage by a common boundary, the boundary having a first surface and a second surface. The first surface is described by a plurality of curvilinear surfaces joined at the ends thereof into a sinuous curvilinear surface and the second surface is described by a plurality of curvilinear surfaces joined at the ends thereof into a sinuous curvilinear surface. The curvilinear surfaces of the first and the second curvilinear surfaces are defined by a portion of an inverse square curve.

12 Claims, 5 Drawing Sheets

2

IN THE RATE OF ENERGY TRANSFER ACROSS BOUNDARIES

RELATED APPLICATION DATA

This Application is a non-provisional application of Applicant's provisional application Ser. No. 60/638,299 filed on 21 Dec. 2004 and Applicant claims the priority established with the filing thereof. The entire specification of Applicant's provisional application is incorporated into this application by this reference thereto.

BACKGROUND OF THE INVENTION

1. Field of the Invention

This invention relates to a method and apparatus for improved energy transfer rate using inverse square curve energy transfer interfaces. Materials of different compositions may be employed in devices manufactured according to the teachings of this invention.

2. Prior Art Statement

It is known to provide an acoustical ceiling in the general quadratic curve shape wherein the first panel of the ceiling is arranged above the performance stage at a steep slope, the angle of subsequent panels flattening out as the distance from the stage increases. It is generally accepted that the panels of this acoustical ceiling are arranged in a parabolic shape with the performance stage located at the focus of the parabola since horns, including musical instruments, have long had a parabolic shape. For instance, see the ceiling panels manufactured by Acoustical Surfaces, Inc., located at 123 Columbia Court North, Suite 201, Chaska, Minn. 55318. The panels of the acoustical ceiling of this patent are arranged with the trailing end of each panel disposed above the leading edge of the subsequent panel, thus providing attenuation of sound emanating from the stage. In a parabola, lines of propagation are parallel to the axis of the parabola in accord with the definition of a parabola. Therefore, in a parabolic horn, sound energy is lost behind the source located at the focus of the parabola. Therefore, there is a need for an acoustical ceiling that allows sound to propagate along a curvilinear surface, particularly a curvilinear surface defined by the inverse square relationship to ensure that proper attenuation of sound is accomplished.

Additionally known is an anechoic chamber comprised of walls having a plurality of shaped bolsters alternately arranged in horizontal and vertical pairs. For instance, see the wall fo an anechoic chamber at the website of Lenard Audio, 32 George St, North Lambton, NSW 2299, Australia. The bolsters are generally open cell foam wedge shaped blocks and may comprise intersecting portions of curvilinear surfaces for opposed surfaces of the wedges. There is a need for further attenuation of sound by providing inverse square curve surfaces of revolution as the bolsters of an anechoic chamber.

It is also known to provide a forty-five degree (45°) helically spiraled corrugated metallic pipe in close proximity to an infrared heat lamp to produce a heating device. For instance, see the U.S. Pat. No. 5,511,145 issued on Apr. 23, 1996 to Bailey, et al. Corrugated metal is well known to be sinusoidal in shape which results in absorption of heat into one side of the metal and radiant propagation from the other side. Since the sinusoidal surface is longer in developed length than a straight panel, a greater surface area is available for radiant transfer, however, there is a need for greater surface area for radiant heat transfer which is available using an inverse square curve shape to the corrugations.

It is further known to provide a copper semi-oval shaped reflector to radiate heat toward a top plate. For instance, see U.S. Pat. No. 1,480,362 issued on Jan. 8, 1924 to Oliver N. Anderson. Similar to a parabola, the semi-oval shape may best be described as an ellipse and the heating source of this patent is located at one focus of the ellipse. Therefore, the heat energy concentrates behind the focus resulting in a hot spot at the surface and subsequent rapid oxidation occurs. The need for a method and apparatus for improving energy transfer using a heat transfer surface in the shape of an inverse square curve is still apparent.

Further known is a "cone shaped" support as a light and air conditioning reflector. For instance, see the U.S. Pat. No. 2,087,240 issued on Jul. 20, 1937 to William A. Brown. The shape of the cone also retains energy behind the source and will also rapidly oxidate as do the ellipse and parabolic shapes. Thus, a method and apparatus for improving energy transfer using a heat transfer surface in the shape of an inverse square curve is needed.

It is also known to provide a "shaped beam" antenna and "advanced synthetic aperture radar" thus compensating for the inverse square law variation in received signal power. For instance, see the European Space Agency article entitled "The ERS-2 Spacecraft and its Payload," Francis, et al., ESA Bulletin Nr. 83, August 1995. Received signal power may be further enhanced by providing an antenna in an inverse square curve shape such that the received signal power is directed along the surface of the inverse square curve.

Finally, it is known to provide heat sink pin fins having a generally straight shape but with internally extending slots disposed upon the vertical walls of the pin fins. The inwardly extending slots serve to enhance the heat transfer by increasing the surface area of the heat sink pin fins. For instance, see the heat sink pin fin shapes of ACK Technology, 6081 Dale St., Unit C, Buena Park, Calif. 90621. Heat transfer may be increased by providing heat sink pin fins having the shape of the inverse square curve and further increased by providing inwardly extending slots also having the shape of the inverse square curve or providing the protrusions between the inwardly extending slots in the shape of the inverse square curve.

SUMMARY OF THE INVENTION

Heat is transferred through the exchanger materials by conduction, with metals generally being the best heat conductors and therefore, the most efficient means of conductive heat transfer. Since the temperature difference between transfer mediums determines the rate of heat transfer, maximizing the temperature at the surface of the heat source exchanger material results in the maximum transfer of heat from the heat source to the cold source. Since temperature varies according to the inverse square curve, a constant temperature line is established in heat pin fins, the constant temperature line only intersecting with the right cylindrical wall of a standard heat pin fin at one place, at the base. Thus, a heat pin fin having a general configuration of an inverse square curve of rotation would present the constant temperature line at the external surface therefore improving the rate of heat transfer from the heat pin fin. A truncated metal cone having the inverse square curve sidewall surfaces provides the greatest temperature gradient spread uniformly over the greatest amount of surface area. Furthermore, the cone shape enhances the formation of mushroom shaped heated volume which rapidly removes the heat by convection.

The application is derived from observation of heat rising from a flat horizontal surface wherein a heated volume cone shaped bubble first forms as a hump on the flat horizontal surface. The bubble continues to form upwardly into a rounded head which continues to rise from the flat horizontal surface until eddy currents begin forming along the flat horizontal surface which causes the bubble to break away from the surface. A chimney effect is created by the rising heated currents causing more rapid transformation of the heated material from the flat horizontal surface into a mushroom shaped volume. Once the bubble breaks from the surface, heat is transferred from the surface to the surrounding area and if presented to an inverted cone of similar shape, the heated bubble will lose heat into the cone in a reverse fashion and therefore heat is transferred most efficiently from one surface to another.

The mathematical expression of the inverse square relationship, $Y=1/X^2$, as plotted on a graph represents the ideal shape when applied to materials intended for conduction, radiation and absorption of energy. The application of the inverse square curve to materials such as metals may then be arranged in many useful shapes and surface contours, hereinafter described. Heat conducting material, when produced with this curve as a truncated cone, represents the ideal shape for the most rapid rate of heat transfer across an exchanger by exposing the greatest amount of surface area of the heat sink. Accordingly, the highest heat density per unit area is achieved and heat sinks are therefore most compact.

Therefore, it is an object of this invention to provide a forged pin fin heat sink which comprises a plurality of forged pin fins extending vertically from a plate wherein the forged pin fins comprise a curvilinear surface of revolution in the shape of an inverse square curve. Preferably, the curvilinear surface of revolution is a concave curvilinear surface of revolution, however, the curvilinear surface of revolution may alternately be convex.

It is a further object of this invention to provide a forged pin fin heat sink comprising a plurality of circular base forged pin fins having a curvilinear surface of revolution of an inverse square curve extending vertically from a plate wherein the plate is a concave curvilinear surface of revolution, the curvilinear surface of revolution of the plate in the shape of an inverse square curve, however the curvilinear surface of the plate may alternately be convex.

It is yet another object of this invention to provide a forged pin fin heat sink comprising a plurality of circular base forged pin fins having a curvilinear surface of revolution of an inverse square curve extending vertically from a plate wherein the circular base forged pin fins have the exposed ends thereof truncated at a specified distance from the plate, the truncation of the exposed ends selected from the group consisting of flat, curvilinear, pointed.

Still another object of this invention is to provide a forged pin fin heat sink comprising a plurality of circular base forged pin fins having a curvilinear surface of revolution of an inverse square curve extending vertically from a plate wherein the plurality of circular base forged pin fins are arranged in an array upon the plate. The circular bases of the circular base forged pin fins in the array are preferably contiguous, but may be spaced apart. Also, preferably the circular base forged pin fins in the array are in offset rows and columns to achieve the maximum pack density of circular base forged pin fins upon the plate, however it is within the scope of this invention to make the array are in regular rows and columns.

A significant object of this invention is to provide a heat plate comprising at least one curvilinear surface having a heat source adjacent one end of the one curvilinear surface wherein heat from the heat source radiates from the curvilinear surface and travels along the curvilinear surface projecting from an end of the curvilinear surface opposite the one end. Preferably, the curvilinear surface is joined to a mirror image curvilinear surface at the one ends thereof thus comprising a curved plate having the heat source located at the one ends. The curved heat plate is preferably concave, but may be convex.

A principal aim of this invention is to provide a heat exchanger comprising at least one first fluid passage contiguous with at least one second fluid passage with the passages separated by a common boundary wherein the boundary has a first surface and a second surface, the first surface described by a plurality of curvilinear surfaces joined at the ends thereof into a sinuous curvilinear surface, the second surface described by a plurality of curvilinear surfaces joined at the ends thereof into a sinuous curvilinear surface and wherein the curvilinear surfaces of the first and the second curvilinear surfaces are defined by a portion of an inverse square curve. Preferably, the first surface has a plurality of fins extending therefrom into the first fluid passage and the second surface has a plurality of fins extending therefrom into the second fluid passage wherein the fins comprise mirror image curvilinear surfaces joined at the apices thereof, the curvilinear surfaces defined by a portion of an inverse square curve.

A goal of this invention is to provide a heat exchanger comprising at least one first fluid passage contiguous with at least one second fluid passage wherein the first fluid passage is defined between two of the second fluid passages, the first fluid passage separated from the second fluid passages by separate boundaries between the first fluid passage and the two second fluid passages, the separate boundaries separated by a defined distance, the first fluid passage thus comprising a sinuous path through the heat exchanger.

Yet another aim of this invention is to provide a heat exchanger comprising at least one first fluid passage contiguous with at least one second fluid passage wherein the first fluid passage is defined between two of the second fluid passages, the heat exchanger further comprising a plurality of the first passages and a plurality of the second passages wherein the number of passages in the plurality of second passages exceeds the number of passages in the plurality of first passages.

An objective of this invention is to provide a radio frequency antenna which transmits radio frequency energy along an inverse square curvilinear surface.

Still another aim of this invention is to provide a radio frequency receiving antenna which receives radio frequency energy along an inverse square curvilinear surface, channeling the received signal to a receiver at one end of the inverse square curvilinear surface.

Another objective of this invention is to provide sound absorption bolsters having surfaces in the general shape of the inverse square curvilinear surface to absorb sound along the curvilinear surface for greater acoustic damping.

Still another aim of this invention is to provide a heat pipe having a inverse square curve curvilinear shape wherein condensation of the fluid in the heat pipe condenses along the constant temperature line with the fluid traveling toward the reservoir along the constant temperature line defined by the inverse square curvilinear interior surface.

Yet another goal of this invention is to provide a cooling tower having an inverse square curvilinear inside surface thus establishing a constant temperature line of condensation.

DESCRIPTION OF THE PREFERRED EMBODIMENTS

While the various features of this invention are hereinafter described and illustrated as a method and apparatus for improved energy transfer rate using inverse square curve energy transfer interfaces, it is to be understood that the various features of this invention can be used singly or in various combinations thereof as can hereinafter be appreciated from a reading of the following description.

Figure 1:
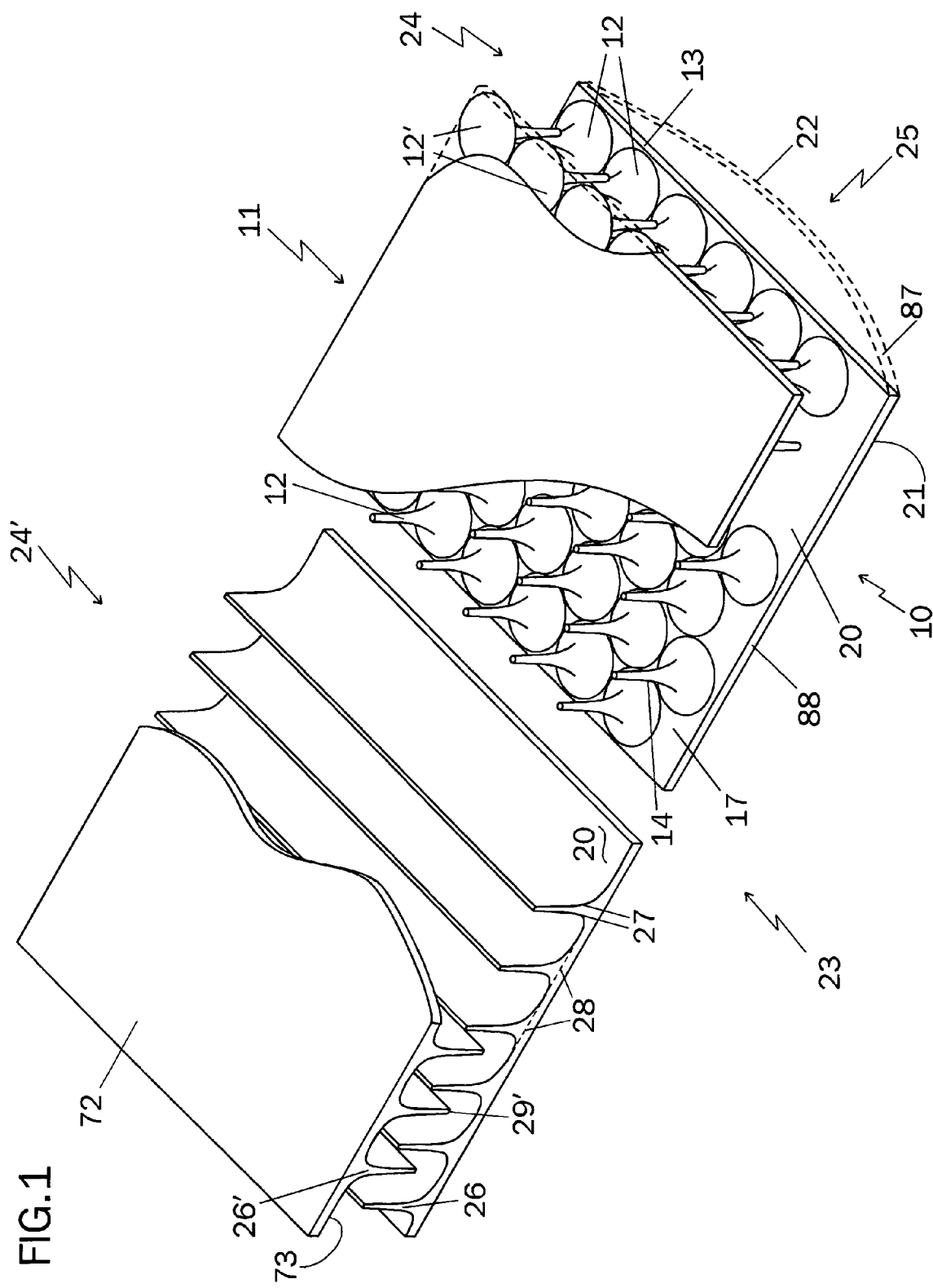
FIG. 1 is a perspective view of an embodiment of a pin fin heat sink having pin fins in the preferred shape of the inverse square curve.
Figure 3:
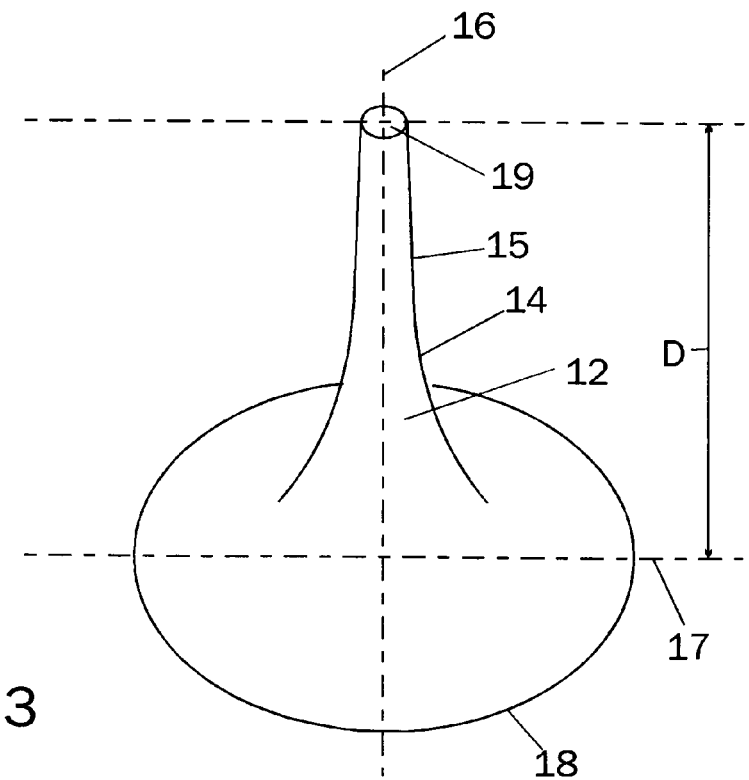
FIG. 3 is an enlarged perspective view of the circular base forged pin fins of the embodiment shown in FIG. 1.

Referring now to FIG. 1, a forged pin fin heat sink 10 comprises a plurality 11 of circular base forged pin fins 12 extending vertically from a plate 13, the circular base forged pin fins 12 comprising a curvilinear surface of revolution 14, curvilinear surface of revolution 14 having the general shape of an inverse square curve defined by the equation $Y=1/X^2+C$, C representing a constant to displace the inverse square curve from the vertical axis when desired. Since the inverse square curve is infinite in length along both axes of a graph, it is obvious that it is practical to use only a portion of the inverse square curve adjacent the origin. Preferably, when C=0, the portion of the curve defined by $0.25>x>4$ is best used to advantage, however, it is fully within the scope of this invention to utilize any portion of the inverse square curve to accomplish the purposes herein described. Referring also to FIG. 3, preferably, forged pin fin heat sink 10 has circular base forged pin fins 12 with curvilinear surface of revolution 14 disposed as a concave curvilinear surface of revolution 15. Curvilinear surface of revolution 14 is defined about axis 16 wherein an inverse square curve is rotated about vertical axis 16 through 360 degrees to complete circular base forged pin fin 12. Circular base forged pin fin 12 rests upon a circular base 18 substantially contiguous with a horizontal axis 17. Thus the inverse square curve describing concave curvilinear surface of revolution 15 is defined by the equation $Y=1/X^2+C$ where C=0 and X varies between 0.25 and 4 units from vertical axis 16. Circular base forged pin fin 12 is then translated toward axis 17 until base 18 rests upon horizontal axis 17, horizontal axis 17 contiguous with an upper surface 20 of plate 13. In a heat sink, such as forged pin fin heat sink 10, plate 13 has a heat source, usually an electronic device, not shown, affixed to the underside 21 thereof wherein heat from the heat source is conducted through plate 13 and dissipated to a cold source, such as the atmosphere, by circulating air over upper surface 20. Forged pin fin heat sink 10 has plurality 11 of circular base forged pin fins 12 disposed thereupon to assist with dissipation of heat from plate 13, plurality 11 of circular base forged pin fins 12 having substantially the same surface area as cylindrical forged pin fins, however, circular base forged pin fins 12 having curvilinear surface of revolution 14 are more efficient in dissipation of heat from plate 13 as the exterior surface constitutes curvilinear surface of revolution 14 which extends from circular base 18 to terminal end 19. Since circular base forged pin fins 12 of this invention are preferably contiguous one with another, the entirety of upper surface 20 of plate 13 has heat transmitted therefrom, the heat radiating from the entirety of curvilinear surface of revolution 14 as curvilinear surface of revolution 14 is substantially at the same temperature as plate 13 whereas in a cylindrical forged pin fin, the external surface thereof is generally lower in temperature than plate 13 because the constant temperature line is disposed inwardly of the exterior surface. Therefore, it is clear that curvilinear surface of revolution 14, which is substantially at the same temperature as plate 13, provides superior heat transfer capacity over the known cylindrical forged pin fins.

In the preferred embodiment shown in FIG. 1 in solid lines, plate 13 of forged pin fin heat sink 10 is a flat plate, however, plate 13 may itself be a curvilinear surface of revolution 22 in the shape of an inverse square curve, curvilinear surface of revolution 22 shown in dashed lines. Generally, larger heat dissipation devices utilize curvilinear surface of revolution 22 as plate 13 having plurality 11 of circular base forged pin fins 12 extending into at least one fluid passage as will hereinafter be fully disclosed. Typically, larger heat dissipation devices are constructed with curvilinear surface of revolution 22 as a concave curvilinear surface.

As hereinbefore stated, circular base forged pin fins 12 have a curvilinear surface of revolution 14 as the exterior surface thereof, curvilinear surface of revolution 14 described by a portion of an inverse square curve having the general formula $Y=1/X^2+C$, which has no terminus. Therefore, circular base forged pin fins 12 of forged pin fin heat sink 10 preferably have the exposed terminal ends 19 thereof truncated at a specified distance D from horizontal axis 17 and thus also from plate 13. Preferably, exposed terminal ends 19 are flat, however may also be curvilinear or pointed. When curved, terminal ends 19 may be hemispherical having a radius equal to $(X)_d+C$, that is, the value of X at distance D plus the translation distance C from axis 16, and similarly, when pointed as with a right circular cone, the base of the cone may have a radius equal to $(X)_d+C$. It is also within the scope of this invention to provide a curvilinear surface for terminal ends 19 in the shape of an inverse square curve. As the horizontal leg of the inverse square curve is asymptotic to the horizontal axis as X increases in the same manner as the vertical leg approaches the vertical axis as X decreases, it should be readily apparent then that circular base 18 of each of circular base forged pin fins 12 of this invention has been truncated. Preferably, for circular bases 18, inverse square curve is truncated at $(X)_d=4$ though a greater or lesser number may be used while still falling within the scope of this invention. Since circular bases 18 are generally truncated at $(X)_d=4$, terminal ends 19 are displaced from axis 16 by a distance of 0.25, circular base forged pin fins have a height from base 18 about four times the radius of base 18 wherein the height is substantially equal to distance D. Of course, it is fully within the scope of this invention to make any of circular base forged pin fins 12 greater in height than adjacent circular base forged pin fins 12 or to make all circular base forged pin fins 12 of the same height as depicted in FIG. 1.

Referring again to FIG. 1, forged pin fin heat sink 10 preferably has plurality 11 of circular base forged pin fins 12 arranged in an array 23 upon plate 13 though a random arrangement is fully within the scope of this invention. Most preferably, forged fin pin heat sink 10 plurality 11 of circular base forged pin fins 12 arranged in the array 23 upon plate 13 have circular bases 18 thereof contiguous with circular bases 18 of two adjacent circular base forged pin fins 12 in two adjacent rows 24 and thus circular base forged pin fins 12 in array 23 have rows 24 offset from columns 25, however, the alternate arrangement of regular rows 24 and columns 25 as shown in FIG. 1 with adjacent circular base forged pin fins 12 in each row and each column having circular bases 18 thereof touching is also within the scope of this invention. Alternately, forged fin pin heat sink 10 may have circular bases 18 of adjacent circular base forged pin fins 12 in array 23 spaced apart by a defined distance. Array 23, when employing spaced apart circular base forged pin fins 12 is usually employed in lower heat rate transmission applications.

Figure 6:
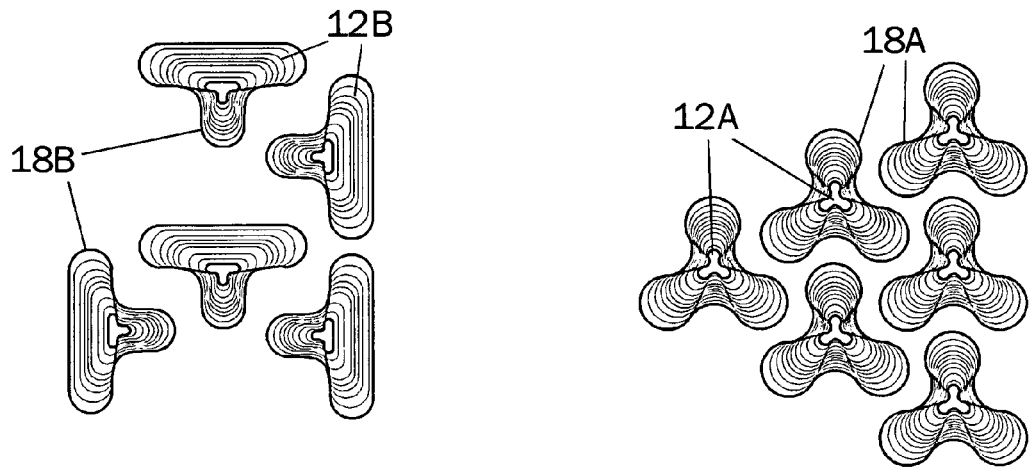
FIG. 6 is a plan view of the base for alternate forged pin fins of the embodiment shown in FIG. 1.
Figure 6:
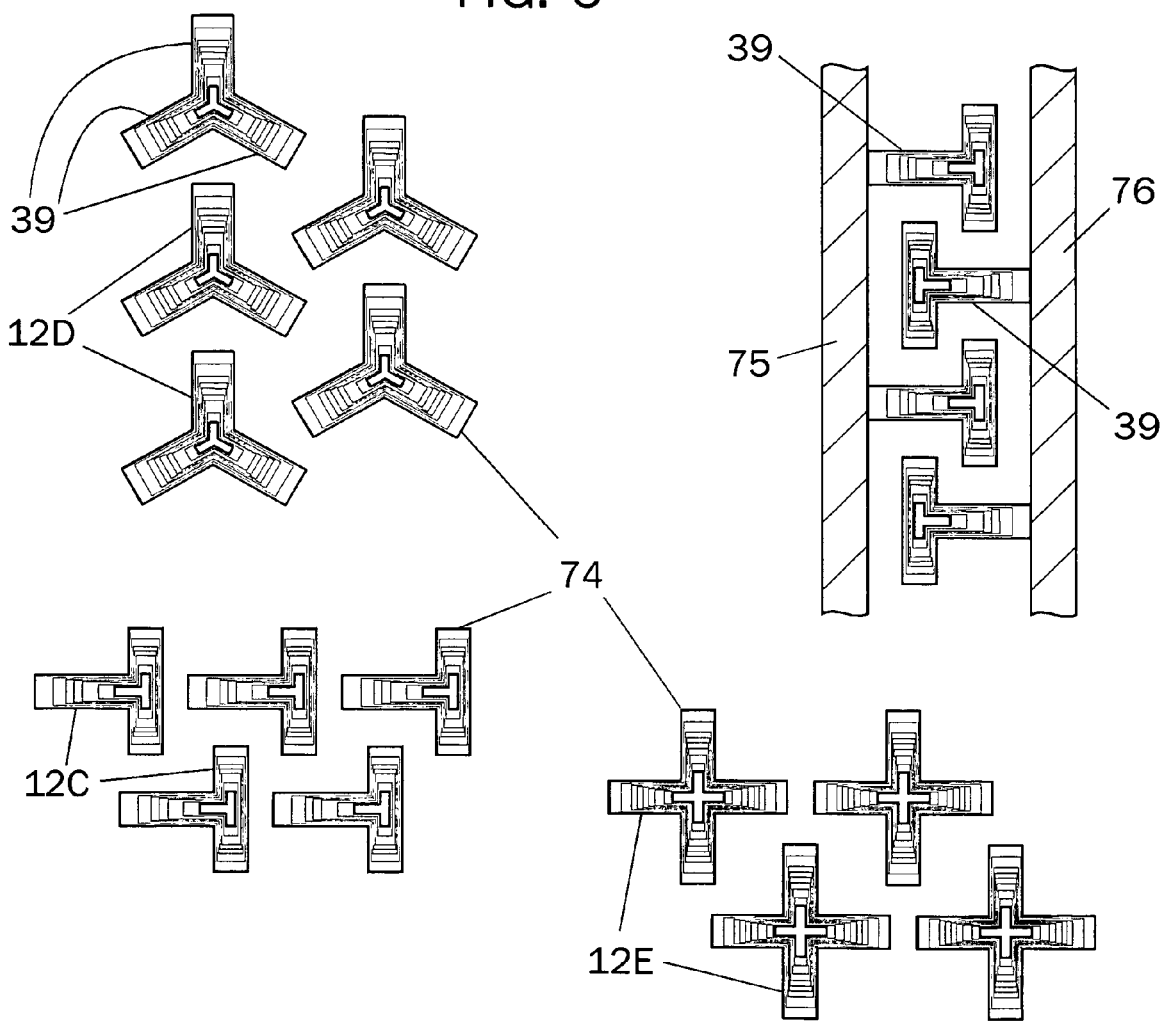

Still referring to FIG. 1, it is also within the scope of this invention to provide elongated fins 26 disposed upon upper surface 17 of plate 13, fins 26 having side surfaces 27 in the general form of an inverse square curve. Fins 26 are preferably arranged upon plate 13 with the bases 28 thereof substantially contiguous, however, it is possible to space apart fins 26 by a specified distance, usually at least the width of terminal end 29 such that fins 26 may be interdigitated with fins 26' from an underside 73 of a heat receiving plate 72 disposed above plate 13 by a distance at least equal to the height of fins 26. Only a portion of heat receiving plate 72 is shown, that portion disposed over the first three fins 26 on plate 13 as these fins 26 are spaced apart by the width of terminal end 29', terminal end 29' of fin 26' on inverted plate 13' contiguous with upper surface 17 of plate 13. Alternately, fins 26' may be of different height than fins 26 and/or fins 26, 26' may have un-equal spacing wherein the spacing of fins 26' is a whole or fractional multiple of the spacing of fins 26. In like manner to fins 26, circular base forged pin fins 12 may be interdigitated with circular base forged pin fins 12', four circular base forged pin fins 12' of a row 24' shown interdigitated with one row 24 of circular base forged pin fins 12 on base 13, it being fully understood that plate 72 has circular base forged pin fins 12' affixed to underside surface 73 thereof in place of fins 26. Interdigitating of forged pins 12, 12' produce a tortuous path for circulation of a fluid therebetween, the fluid carrying heat away from both plates 13, 72. Of course, it is equally possible within the scope of this invention to have heat transferred from circular base forged pin fins 12 to circular base forged pin fins 12' through a medium filling the space between interdigitated pin fins 12, 12' wherein heat is transferred between plates 13 and 72 one plate 13, 72 associated with a heat source while the other plate 72, 13 is associated with a cold sink. It is also within the scope of this invention to provide alternate shapes for circular base forged pin fins 12, 12'. For instance, referring now to FIG. 6, alternate shapes such as tri-lobed base forged pin fins 12a, 12b, T-shaped forged pin fins 12c, tripod base forged pin fins 12d, cross shaped forged pins 12e or combinations thereof have been found to be useful, though these shapes are neither comprehensive nor exhaustive. The vertical surfaces, though not shown, of the aforementioned alternate shapes 12a-12e for circular base forged pin fins 12 have the general form of the inverse square curve of this invention. In the case of the tri-lobed base forged pin fins 12a-b, portions of the vertical surfaces have varying lengths of the inverse square curve to provide for interlacing of the bases 18a-b thereof. In addition, the straight legged forged pin fins 12c-e may have an end 74 of one leg 39 affixed to headers 75, 76 disposed vertically along plates 13, 72 wherein a tortuous path is established between the remaining legs 39.

Figure 5:
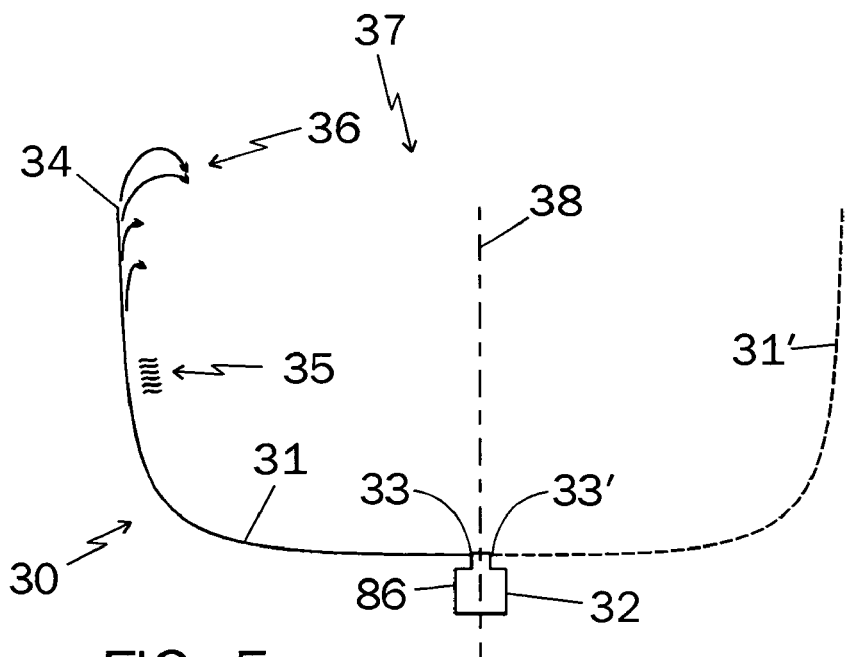
FIG. 5 is frontal view of a heat plate having a heat source at one end, the heat plate having the preferred shape of an inverse square curve.

Referring now to FIG. 5, a heat plate 30 comprising at least one curvilinear surface 31 has a heat source 32 adjacent one end 33 of curvilinear surface 31 wherein heat from the heat source 32 radiates from curvilinear surface 31, as shown at 35, and travels along curvilinear surface 31 projecting from an open end 34 of curvilinear surface 31 opposite one end 33 as shown at 36. Preferably, curvilinear surface 31 is a portion of an inverse square curve described by the general formula $Y=1/X^2+C$. Heat plate 30 may have curvilinear surface joined to a mirror image curvilinear surface 31' at one end 33 thereofthus comprising a curved plate 37 having heat source 32 located at one ends 33, 33'. Preferably, curved plate 37 may be concave as depicted in FIG. 5 but alternately may be convex. Heat source 32 may be chosen from the group consisting of incandescent bulbs, gas or oil flames, resistance heaters, heated fluid tubes, solar energy, heated solids such as stones, marbles, masonry blocks or combinations thereof. Though heat plate 30 and curved plate 37 are shown as planar structures, heat plate 30 may be rotated about an axis 38 passing through one end 33 into a conical structure useful as a heat reflector. Additionally, heat plate 30 may be joined at end 34 by a mirror image of heat plate 30 into a sinuous curve mirror image of heat plate further joined by another mirror image of heat plate 30 and its mirror image, these structures joined end to end extending generally diagonally upwardly and downwardly from heat plate 30 into an elongated heat plate, not shown. Preferably, heat plate 30 is a concave curvilinear surface 31 rotated about axis 38 through 360 degrees with heat source 32 disposed on axis 38 adjacent a central location at one end 33.

Figure 2:
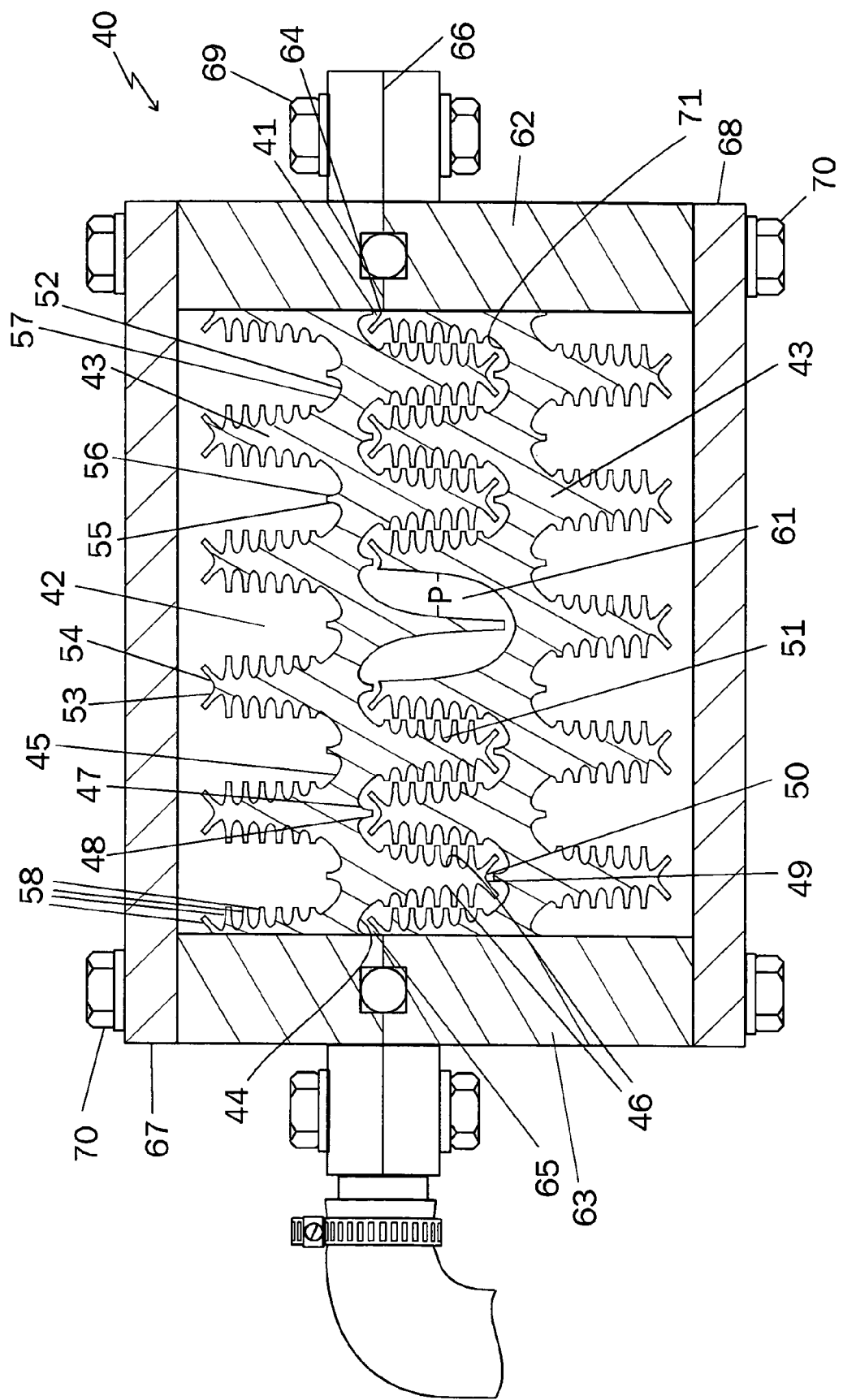
FIG. 2 is a cross sectional view of one tube in a two fluid plate heat exchanger, the hot fluid passage comprising adjoining inverse square curves in sinuous configuration, the hot fluid passage having projections thereinto in the preferred inverse square curve embodiment from the plate material adjacent the cold fluid passage.
Figure 4:
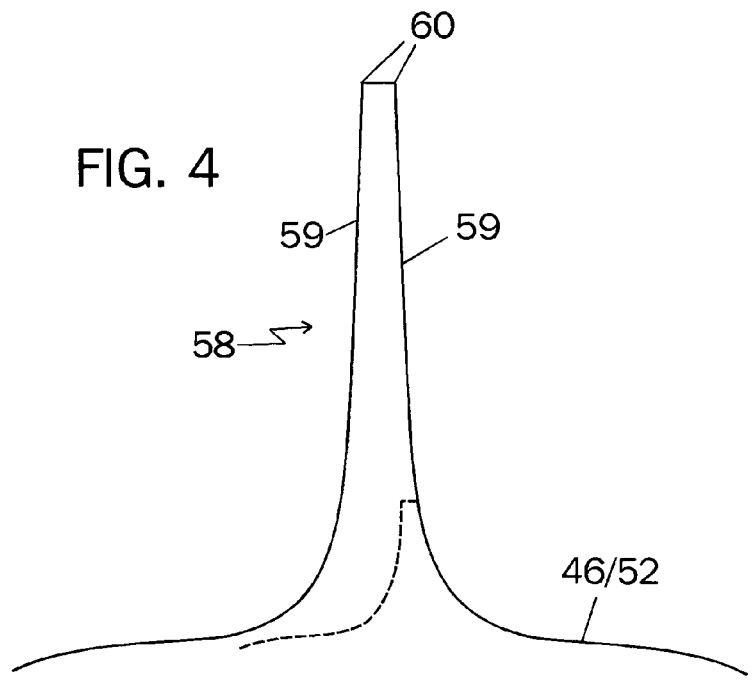
FIG. 4 is an enlarged view of a fin projecting into a fluid passage in the two fluid plate heat exchanger of FIG. 2.

Referring now to FIG. 2, a cross section through a heat exchanger 40 shows at least one first fluid passage 41 contiguous with at least one second fluid passage 42, first fluid passage 41 separated from second fluid passage 42 by a common boundary 43. Common boundary 43 has a first surface 44 and a second surface 45, first surface 44 described by a plurality of curvilinear surfaces 46 joined at the base ends 47, 48 and terminal ends 49, 50 thereof into a sinuous curvilinear surface 51. Second surface 45 is described by a plurality of curvilinear surfaces 52 joined at terminal ends 53, 54 and base ends 55, 56 thereof into a sinuous curvilinear surface 57 wherein curvilinear surfaces 46, 52 of first and second surfaces 44, 45 are defined by a portion of an inverse square curve having the general formula $Y=1/X^2$. Preferably, as shown in FIG. 2, second surface 45 is a mirror image of first surface 44 but offset by one curvilinear surface 46, 52 and thus base ends 55, 56 of second surface 45 are disposed in vertical alignment with terminal ends 49, 50 of first surface 44 thus providing for the smallest possible thickness of common boundary 43 therebetween. A significant savings in material cost is achieved by the arrangement just described, however, it is fully within the scope of this invention to make second surface 45 a duplicate of first surface 44, second surface 45 displaced from first surface 44 by a specified distance such that terminal ends 53, 54 of second surface 45 align with terminal ends 49, 50 of first surface 44 and base ends 55, 56 of second surface 45 align with base ends 47, 48 of first surface though there is generally more mass then associated with boundary 43. With respect to FIG. 2, it is fully understood that fluid passages 41, 42, as well as boundary 43 are elongated in nature and extend into the view depicted. Therefore, a fluid may be disposed below boundary 43 adjacent bottom plate 68 while another or like fluid is disposed above boundary 43 adjacent top plate 67, heat from one fluid transferred to the other fluid through boundaries 43. Preferably, boundaries 43 are formed from a metal selected for highest heat conduction and is constructed as depicted in FIG. 2. Boundaries 43 may be machined from solid material, however, are most readily formed by extrusion through a die producing the shape depicted in FIG. 2. Though boundaries 43 may have smooth curvilinear surfaces 46, 52 as generally described above and as shown centrally located in first fluid passage 41 between sinuous curvilinear surfaces 51 and 71 hereinafter described, it is preferred that curvilinear surfaces 46, 52 have fins 58 projecting outwardly therefrom, fins 58 generally in the form of the inverse square curve $Y=1/X^2$. Therefore, first surface 44 of heat exchanger 40 has a plurality of fins 58 extending therefrom into first fluid passage 41, fins 58, best shown in FIG. 4, comprises mirror image curvilinear surfaces 59 joined at the apices 60 thereof, curvilinear surfaces 59 defined by a portion of an inverse square curve. Likewise, it is preferred that second surface 45 of heat exchanger 40 also has a plurality of fins 58 extending therefrom into second fluid passage 42, fins 58 comprising mirror image curvilinear surfaces 59 joined at the apices 60 thereof, curvilinear surfaces 59 defined by a portion of an inverse square curve. Fins 58 also extend longitudinally into the view shown in FIG. 2 thus creating an elongated planar heat exchanger as heat exchanger 40. Fins 58 may have an aspect ratio of height to base width of about 4, however, fins 58 may be truncated at apices 60 into a shorter aspect ratio as shown in dashed lines in FIG. 4. Of course, fins 58 may alternately have an aspect ratio greater than 4, however, it has been found by the inventor hereof that aspect ratios greater than 4 are more difficult to produce. By providing fins 58 on curvilinear surfaces 46, 52 of first and second surfaces 44, 45, the greatest rate of heat transfer between a fluid in fluid passage 41 to a fluid in fluid passage 42 may be achieved while minimizing the quantity of material used for boundaries 43.

Preferably, heat exchanger 40 has first fluid passage 41 defined between two second fluid passages 42, first fluid passage 41 separated from second fluid passages 42 by separate boundaries 43 between first fluid passage 41 and two second fluid passages 42, separate boundaries 43 separated by a defined distance P, first fluid passage 41 thus comprising a sinuous path 61 through heat exchanger 40. Sinuous path 61 is created between sinuous curvilinear surface 51 of first surface 44 on one boundary 43 and a duplicate sinuous curvilinear surface 71 of first surface 44 on the other boundary 43. Heat exchanger 40 would typically be used for heat transfer between a liquid flowing through first fluid passage 41 with air passing through fluid passages 42 such as a radiator of a vehicle. The liquid in first fluid passage 41 would pass through sinuous path 61 from right to left in FIG. 2 while air in fluid passage 42 would pass in the direction into or out from the view. Of course, heat exchanger 40 may have liquids in both passages 41, 42 by placing additional headers (not shown) on the opposed ends of heat exchanger 40, one opposed end at the face of the view while the other is spaced substantially behind the view, to provide for introduction and discharge of the fluid in second fluid passage 42. Heat exchanger 40 in FIG. 2 is especially useful in the medical field or in food service as heat exchanger 40 may be readily disassembled and cleaned. First fluid passage 41 is separable into two distinct halves by splitting heat exchanger 40 in half along parting line 66 by removing parting line bolts 69 but without removal of top plate 67 and bottom plate 68. Top and bottom plates 67, 68 are held to header plates 62, 63 with plate bolts 70 which pass through top plate 67 and are secured into headers 62, 63 and through bottom plate 68 and secured into headers 62, 63. It is readily apparent that upon removal of top and bottom plates 67, 68, second fluid passages 42 may be readily accessed and cleaned as the entirety of second surface 45 is exposed. Likewise, first fluid passage 41 may be easily cleaned as the entirety of sinuous curvilinear surface 51 comprising first surface 44 is exposed upon splitting first fluid passage 41 at parting line 66.

Heat exchanger 40 may further comprise a plurality of first fluid passages 41 separated by boundaries 43 from a plurality of second fluid passages 42, first fluid passages 41 joined by headers 62, 63 on opposed ends 64, 65 thereof, one header 62, comprising an inlet header while the opposite header 63 comprises an outlet header. Preferably, in a planar heat exchanger, such as heat exchanger 40 in FIG. 2, the number of passages in the plurality of second fluid passages 42 would exceed the number of passages in the plurality of first fluid passages 41, usually according to the expression n+1. In a tube bundle heat exchanger, however, first fluid passages 41 are supported in an enlarged cylinder by tube sheets as headers 62, 63 and therefore, second fluid passage 42 may be considered to be a single fluid passage. Thus, the number of first fluid passages 41 greatly exceeds the number of second fluid passages 42.

Figure 7:
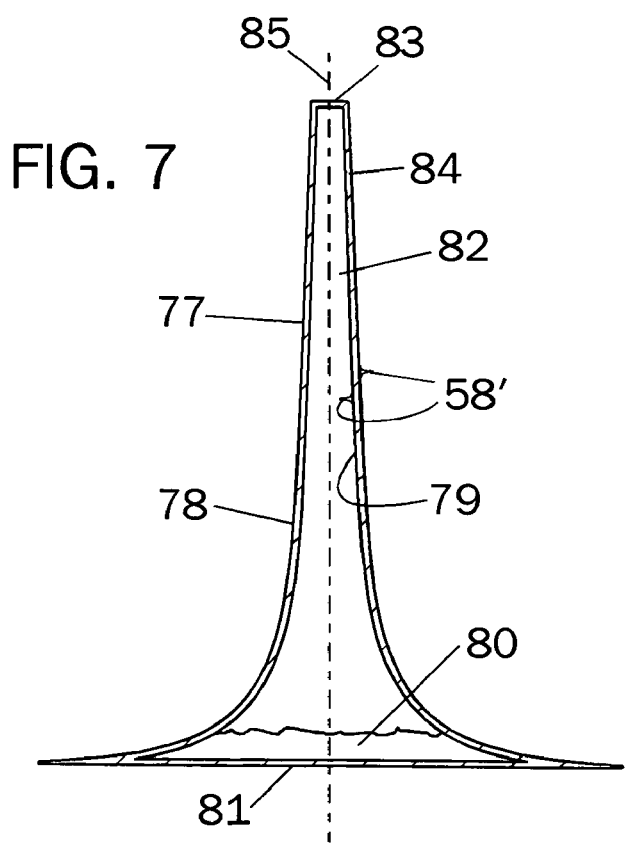
FIG. 7 is an enlarged view of a heat pipe in the preferred inverse square curve embodiment.

Referring now to FIG. 7, a heat pipe 77 is shown in cross section wherein heat pipe 77 has an internal volume 82 partially filled with a liquid 80. In a heat pipe such as heat pipe 77, heat is applied to base 81, liquid 80 boils and rises toward tip 83 of heat pipe 77, the vapor condensing on an interior surface 79 of heat pipe 77 giving off heat to the surroundings. In the instant invention, since heat pipe 77 has internal surface 79 and external surface 78 in the general form of an inverse square curve, both external surface 78 and internal surface 79 are constant temperature lines thus rapidly transferring heat into wall 84 of heat pipe 77 and radiating heat from external surface 78. As internal surface 78 is preferably in the shape of the inverse square curve, condensation moves rapidly downward along inside surface 78 toward base 81 thus entering the remaining portion of liquid 80 for reheating thus providing for a continuous cycle of heat transfer. Heat pipe 77 is preferably of cylindrical shape similar to forged pin fins 12 described above, though hollow, and thus has an axis 85 passing centrally therethrough although it is fully within the scope of this invention to make heat pipe 77 as an elongated bar closed at both ends to ensure containment of liquid 80. Though it is preferred that both internal surface 79 and external surface 78 are portions of an inverse square curve, either surface may be another shape without departing from the scope of this invention. It is also within the scope of this invention to invert heat pipe 77 such that liquid volume 80 is adjacent end 83 wherein heat is applied to end 83, the vapor produced by the boiling thereof rising upwardly toward base 81 and condensing on internal surface 79 thus transferring heat through wall 84 to external surface 78 and radiating heat to the surroundings, the condensed liquid returning along internal surface 79 to liquid volume 80 for reheating. Furthermore, though tip 83 is shown to be flat, tip 83 may be formed in any manner such as curvilinear or pointed. Additionally, either external surface 78 or internal surface 79 may have fins 58' affixed thereto in the same manner as discussed above with fins 58 disposed into fluid passages 41, 42 of heat exchanger 40. Fins 58' may be of any shape, however, it is preferred that fins 58' have at least a portion thereof in the shape of the inverse square curve. Finally, though base 81 is shown in FIG. 7 to be flat, base 81 may also be a portion of an inverse square curve and thus heat pipe 77 may be attached to a much larger heat pipe, wherein heat pipe 77 thus becomes a fin 58'.

Still referring to FIG. 7, a cooling tower may be formed in the same general shape by removing base 81 and tip 83 wherein heated water is sprayed through injectors into an air stream passing upwardly through internal volume 82, the heated water giving up heat to the air stream in proportion to the dry bulb temperature of the incoming air. In a cooling tower, internal surface 79 is a surface of revolution spaced at an extended radius from axis 85 though still retaining the general shape of the inverse square curve. Base 81 and tip 83 are obviously also enlarged, however, base 81 and tip 83 are open for passage of air therethrough. Though cooling towers generally have an hyperbolic shape, it has been found by the inventor hereof that the inverse square curve shape of internal surface 79 enhances the velocity of air flow from the base thereof therefore enhancing heat transfer to the air stream at the water injectors.

Referring now to FIG. 5, curvilinear surfaces 31, 31' may also be used as an antenna for receiving electromagnetic waves thereonto, the electromagnetic waves proceeding along curvilinear surfaces 31, 31' to ends 33, 33' wherein the electromagnetic waves are received in a receiver 86 replacing heat source 32. Thus, curvilinear surfaces 31, 31' function as directors to direct the electromagnetic waves to receiver 86.

Forged pin fin heat sink 10 may be manufactured by numerous methods, however, preferably is formed as an elongate plate 13 of specified width having circular base forged pin fins 12 affixed thereto. Forged pins 12 may be affixed to plate 13 in any conventional manner and are most preferably affixed by bolts passing through underside 21 into each circular base forged pin fin 12. Plurality 11 of circular base forged pin fins 12 are arranged on plate 13 in rows 24 and columns 25 preferably with bases 18 substantially touching. As hereinbefore recited, rows 24 and columns 25 may be evenly disposed on plate 13 or may be offset in order to ensure complete packing of upper surface 17. Receiver plate 72 may be similarly constructed with rows and columns 25 spaced for interdigitation with rows 24 and columns 25 on plate 13. Circular base forged pin fins 12 are preferably solid material and may be cold-headed, machined, cast or forged and are most preferably of steel, however, any suitable metal may be used. Furthermore, circular base forged pin fins 12 may be clad with another metal. In an alternate method of manufacture, pin fins 12 may be machined on plate 13 from a solid material plate of a thickness to fully encompass the full height of pin fins 12 and thickness of plate 13, pin fins 12 formed by passing a cutting tool of suitable shape at 120 degree angles across surface 17 of plate 13. A cutter of mating shape, in this case, substantially the reverse of circular base forged pin fin 12, is inverted and rotated about its axis while being passed at the specified cross angles across upper surface 17 of plate 13 thus leaving pin fins 12 having a generally triangular base 19 and triangular top 19. It should be readily apparent then that plate 72 may be similarly constructed with the rows 24 offset from end 87 of plate 13 by one half of the diameter of base 81 and columns 25 offset from edge 88 of plate 13 by a similar distance. Thus, pin fins 12' may be of the same height as pin fins 12 and may be readily interdigitated with the triangular tops thereof received in the triangular cut formed between adjacent rows 24 and columns 25 with the tops resting directly upon upper surface 17 of plate 13. Likewise, circular base forged pin fins 12 may be interdigitated with triangular based pin fins 12 provided that the spacing of rows 24 on receiver plate 72 is a multiple of the spacing of the rows 24 on plate 13. It should be readily apparent here that other shapes for pin fins 12 such as those shown in FIG. 6 may be arranged upon base 13 of heat sink 10 and interdigitated with pin fins 12' of similar or different shape on plate 72 wherein a tortuous path is established between the interdigitated pin fins 12, 12' thus improving the efficiency of forged pin fin heat sink 10.

In another alternate embodiment, elongated fins 26 may be disposed on upper surface 17 of plate 13 by arranging elongated fins 26 regularly upon plate 13 and affixing elongated fins 26 thereto. Elongated fins 26 may be affixed by conventional fasteners or may be welded to upper surface 17. Elongated fins 26 may be machined individually or may be cast or forged from suitable materials with bases 28 of elongated fins 26 touching or spaced apart as hereinbefore recited. Receiver plate 72 may also have elongated fins 26 disposed thereupon wherein fins 26 on plate 13 are offset from pins 26' of receiver plate 72. It is also possible to interdigitate plate 72 having elongated fins 26 disposed thereupon with heat plate 13 having rows 24 and columns 25 of pin fins 12 thereupon, elongated fins 26 arranged between adjacent rows 24.

Heat exchanger 40 is manufactured by extruding elongated common boundaries 43 from a suitable metal, common boundaries 43 having first surface 44 on one side thereof and second surface 45 on the other side. At least two common boundaries 43 are then affixed to headers 62, 63 but spaced apart by a distance equal to distance P thus establishing fluid passage 41 therebetween. Additional common boundaries may be similarly joined to headers 62, 63 to make an elongated heat exchanger 40 for industrial, automotive and home uses. For such an elongated heat exchanger 40, additional headers (not shown) are disposed on the side edges of fluid passages 41 to thus contain the fluid passing therethrough, the additional headers generally covering fluid passages 41 while leaving fluid passages 42 open for passing of another fluid therethrough. Top and bottom plates 68, 69 respectively are then affixed to headers 62, 63 with bolts passing through top and bottom plates 68, 69 into headers 62, 63. Since heat exchanger 40 is so simply constructed, heat exchanger 40 may be easily disassembled thus providing for easy cleaning of fluid passages 41, 42. Heat exchanger 40 is thus highly sought for food service purposes.

Curved plate 37 is made by forming a sheet of material against a form having the shape depicted in FIG. 5. Where curved plate 37 is used for a heat plate, preferably the material is metallic thus allowing for heating of curved plate 37 as well as radiation therefrom, however, where curved plate 37 is used as an antenna, the preferred material is one of the thermoplastics selected from the group including polytetrafluoroethylene, polypropylene, polyethylene, polyamide, polyparabenzamide, silicone, viton, chloroprene, ethylene propylene polymer, isoprene, butyl, polystyrene or combinations thereof as now widely used industry. The thermoplastic material may also contain reinforcing materials such as fiberglass, metal fibers, thermoplastic fibers or carbon fibers. Curved plate 37 may be made into a surface of revolution by rotating a sheet of material about an axis and forming the sheet into the inverse square curve shown in FIG. 5 wherein curved plate 37 may be used for a variety of purposes.

Preferably, heat pipe 77 is made from a cylindrical metallic tube having internal surface 79 formed in the shape of the inverse square curve by rotating the cylindrical metallic tube about axis 85 while pressing a forming tool against internal surface 79. By so shaping internal surface, wall 84 substantially assumes the same shape thus forming external surface 78 into the general shape of the inverse square curve. One end, 81, 83 is then sealed by affixing a cap to the respective end of wall 84, fluid 80 is added and the other end 83, 81 is sealed to wall 84 thus producing an hermetically sealed container for transfer of heat from a heated surface below base 81 toward top end 83. Heat pipe 77 may be made from copper or an alloy thereof, however, it is possible to make heat pipe 77 from the metals selected from the group consisting of iron, copper, steel, zinc, titanium, platinum or alloys thereof.

A cooling tower may be formed of metals, wood, thermoplastics, cement board, fiberglass affixed to a frame wherein the wall of the cooling tower is shaped into the form of the inverse square curve while being affixed to the frame. Sheets of the wall of the cooling tower may be preformed into the general shape of the inverse square curve prior to being attached to the frame. Likewise, an antenna may be formed onto a frame or have sheets preformed before affixing to the frame.

While the present invention has been described with reference to the above described preferred embodiments and alternate embodiments, it should be noted that various other embodiments and modifications may be made without departing from the spirit of the invention. Therefore, the embodiments described herein and the drawings appended hereto are merely illustrative of the features of the invention and should not be construed to be the only variants thereof nor limited thereto.

I claim:

1. A pin fin heat sink comprises a plurality of circular base pin fins extending from a plate, said circular base pin fins comprising a curvilinear surface of revolution, said curvilinear surface of revolution defined by an inverse square curve, said curvilinear surface of revolution extending from said circular base to an end of said pin fin wherein said inverse square curve matches a line of constant temperature of said pin fin.

2. A pin fin heat sink as in claim 1 wherein said curvilinear surface of revolution is a concave curvilinear surface of revolution.

3. A pin fin heat sink as in claim 1 wherein said circular base pin fins have the exposed ends thereof truncated at a specified distance from said plate.

4. A pin fin heat sink as in claim 3 wherein said exposed ends are flat.

5. A pin fin heat sink as in claim 1 wherein said plurality of circular base pin fins are arranged in an array upon said plate.

6. A fin pin heat sink as in claim 5 wherein circular bases of said circular base pin fins in said array are contiguous.

7. A fin pin heat sink as in claim 5 wherein said circular bases of said circular base pin fins in said array are spaced apart.

8. A pin fin heat sink comprises a pair of spaced apart flat plates said flat plates further comprising a plurality of circular base pin fins extending from one side of said flat plates, said circular base pin fins comprising a curvilinear surface of revolution, said curvilinear surface of revolution defined by an inverse square curve, said curvilinear surface of revolution extending from said circular base to an end of said pin fin wherein said inverse square curve matches a line of constant temperature of said pin fin.

9. A pin fin heat sink as in claim 8 wherein said curvilinear surface of revolution is a concave curvilinear surface of revolution.

10. A pin fin heat sink as in claim 9 wherein said circular base pin fins of one said flat plate has exposed ends thereof disposed adjacent an inside surface of an opposed said flat plate.

11. A pin fin heat sink as in claim 10 wherein said exposed ends are flat.

12. A pin fin heat sink as in claim 9 wherein said circular base pin fins of one said flat plate has exposed ends thereof disposed adjacent an inside surface of an opposed said flat plate, said ends of said circular base pin fins disposed adjacent a base of at least one said circular base pin fin of said opposed said flat plate.

* * * * *